(12) United States Patent
Tang et al.

(10) Patent No.: US 10,592,625 B1
(45) Date of Patent: Mar. 17, 2020

(54) CELL-AWARE ROOT CAUSE DECONVOLUTION FOR DEFECT DIAGNOSIS AND YIELD ANALYSIS

(71) Applicant: Mentor Graphics Corporation, Wilsonville, OR (US)

(72) Inventors: Huaxing Tang, Wilsonville, OR (US); Manish Sharma, Wilsonville, OR (US); Wu-Tung Cheng, Lake Oswego, OR (US); Gaurav Veda, Hillsboro, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 16/171,922

(22) Filed: Oct. 26, 2018

Related U.S. Application Data (60) Provisional application No. 62/579,136, filed on Oct. 30, 2017.

(51) Int. Cl.
*G06F 17/50* (2006.01)

(52) U.S. Cl.
CPC .......... *G06F 17/504* (2013.01); *G06F 17/505* (2013.01)

(58) Field of Classification Search
CPC .............................. G06F 17/504; G06F 17/505
USPC ........................................................ 716/106
See application file for complete search history.

(56) References Cited

U.S. PATENT DOCUMENTS

| | | | |
|---|---|---|---|
| 8,930,782 B2 | 1/2015 | Benware | |
| 10,234,502 B1* | 3/2019 | Tang | G01R 31/3177 |
| 2012/0079439 A1* | 3/2012 | Akar | G11C 29/56008 |
| | | | 716/106 |
| 2012/0297264 A1* | 11/2012 | Benware | G01R 31/318544 |
| | | | 714/738 |
| 2015/0234978 A1* | 8/2015 | Tang | G06F 17/5081 |
| | | | 716/112 |
| 2018/0253346 A1* | 9/2018 | Tang | G06F 11/079 |

OTHER PUBLICATIONS

W.T. Cheng, Y. Tian, and S.M. Reddy. "Volume diagnosis data mining." in Proc. of European Test Symp., pp. 1-10, 2017.
Y. Pan, A. Chittora, K. Sekar, G. S. Huat, Y. G. Feng, A. Viswanatha and J. Lam, "Leveraging Root Cause Deconvolution Analysis for Logic Yield Rampling", in Proc. of Intl. Symp. of Testing and Failure Analysis, pp. 602-607, 2013.

(Continued)

*Primary Examiner* — Suresh Memula (57) ABSTRACT

Logic diagnosis is performed on failing reports of defective integrated circuits to derive a diagnosis report for each of the failing reports which comprise information of suspects. The suspects comprise cell internal suspects and interconnect suspects. A probability distribution of root causes for causing the defective integrated circuits is determined to maximize a likelihood of observing the diagnosis reports based on a probability for each of the suspects given each of the root causes and a probability for each of the diagnosis reports given each of the suspects. The probability for each of the diagnosis reports given each of the cell internal suspects is weighted higher than the probability for each of the diagnosis reports given each of the interconnect suspects.

18 Claims, 9 Drawing Sheets

Flow chart 600

(56) References Cited

OTHER PUBLICATIONS

B. Benware, C. Schuermyer, M. Sharma and T. Hermann, "Determining a Failure Root Cause Distribution from a Population of Layout-Aware Scan Diagnosis Results", in IEEE Design & Test of Computers, vol. 29, No. 1, pp. 8-18, 2012.

M. Sharma, C. Schuermyer, and B. Benware, "Determination of Dominant-Yield-Loss Mechanism with Volume Diagnosis," in IEEE Design & Test of Computers, vol. 27, No. 3, pp. 54-61, 2010.

H. Tang, M. Sharma J. Rajski, M. Keim, and B. Benware, "Analyzing Volume Diagnosis Results with Statistical Learning for Yield Improvement," in Proc. of European Test Symp., pp. 145-150, 2007.

H. Tang, B. Benware, M. Reese, J. Caroselli, T. Herrmann, F. Hapke, R. Tao, W.-T. Cheng, and M. Sharma, "Diagnosing Cell Internal Defects Using Analog Simulation-based Fault Models," Asian Test Symposium, 2014.

F. Hapke, M. Reese, J. Rivers, A. Over, V. Ravikumar, W. Redemund, A. Glowatz, J. Schloeffel, and J. Rajski, "Cell-Aware Production Test Results from a 32-nm Notebook Process," International Test Conference, paper 1.1, 2012.

C. Schuermyer, S. Malik, and T. Herrmann, "Identifying systematic critical features using silicon diagnosis data", in Proc. of Advanced Semiconductor Manufacturing Conf., pp. 15-17, May 2012.

\* cited by examiner

Flow chart 600

FIG. 6

Flow chart 700

CELL-AWARE ROOT CAUSE DECONVOLUTION FOR DEFECT DIAGNOSIS AND YIELD ANALYSIS

RELATED APPLICATIONS

This application claims the benefit of U.S. Provisional Patent Application No. 62/579,136, filed on Oct. 30, 2017, titled "Cell-Aware Root Cause Deconvolution For Defect Diagnosis And Yield Analysis," and naming Huaxing Tang et al. as inventors, which application is incorporated entirely herein by reference.

FIELD OF THE DISCLOSED TECHNIQUES

The presently disclosed techniques relates to circuit testing, defect diagnosis and yield analysis. Various implementations of the disclosed techniques may be particularly useful for identifying root causes of circuit defects.

BACKGROUND OF THE DISCLOSED TECHNIQUES

Traditionally, scan diagnosis is used to determine the most likely faulty locations and fault types for a given failing integrated circuit device (die). The diagnosis results guide physical failure analysis (PFA) to locate defects and identify the root cause. Defects are typically classified into two categories based on defect locations. A defect in a library cell is called a cell internal defect, and a defect on interconnecting wires is called an interconnect defect. Defects can also be classified into open defects and bridge defects. Various fault models are developed to address different fault effects and layout information is incorporated into the diagnosis process. The improved diagnosis accuracy and resolution enable failure analysis engineers to focus on smaller areas. This leads to higher PFA success rates and lower turnaround time and costs.

Despite advancements in scan diagnosis, diagnosis resolution or accuracy is still not sufficiently high. Multiple defect suspects are typically reported for each failing integrated circuit device. Some of these defect suspects may be real defects while the other may be fake defects (false positives). The real defects may include random defects and systematic defects. The latter is critical for the yield improvement. Moreover, each of the defect suspects can involve multiple physical features such as bridging defects on several physical layers. It would further improve PFA success rates and reduce turnaround time and costs if a small handful of physical features (root causes) explaining most if not all of the defects could be identified. Using an unsupervised machine learning technique to analyze diagnosis results for volume failing dies, root cause deconvolution can achieve this goal.

Conventional root cause deconvolution is based on scan diagnosis for only interconnect defect suspects and cell defect suspects. Internal defects within a cell are represented by a cell defect model. This limits the effectiveness of both scan diagnosis and root cause deconvolution. As the semiconductor technology nodes move from 14 nm to 10 nm, 7 nm and beyond, cell internal defects occur more often than before. Direct combination of conventional root cause deconvolution and cell-aware diagnosis, however, often cannot identify a correct root cause distribution.

BRIEF SUMMARY OF THE DISCLOSED TECHNIQUES

Various aspects of the disclosed technology relate to cell-aware yield analysis. In one aspect, there is a method, executed by at least one processor of a computer, comprising: receiving failure reports for a plurality of integrated circuits fabricated according to a circuit design, each of the failure reports comprising test results obtained using test patterns to test one of the integrated circuits, each of the integrated circuits generating test responses different from good-machine test responses for at least one of the test patterns; performing logic diagnosis on the failing reports to derive a diagnosis report for each of the failing reports, the diagnosis report comprising information of suspects, the suspects comprising cell internal suspects and interconnect suspects; determining a probability distribution of root causes which maximizes a likelihood of observing the diagnosis reports based on a probability for each of the suspects given each of the root causes and a probability for each of the diagnosis reports given each of the suspects, each of the root causes being a physical layout feature that can cause defects, the probability for each of the suspects given each of the root causes being determined based on layout information of the circuit design, the probability for each of the diagnosis reports given each of the suspects being determined based on results of the logic diagnosis, the probability for each of the diagnosis reports given each of the cell internal suspects being weighted higher than the probability for each of the diagnosis reports given each of the interconnect suspects; and storing information of the probability distribution of the root causes.

The method may further comprise: performing physical failure analysis on some of the integrated circuits to confirm existence of one or more of the root causes having the highest probabilities. The method may still further comprise: adjusting a manufacturing process based on the confirmed existence of one or more of the root causes.

The probability for each of the diagnosis reports given each of the cell internal suspects may be weighted higher than the probability for each of the diagnosis reports given each of the interconnect suspects by a factor of between 1.5 and 4. The probability for each of the suspects given each of the root causes may be determined at least in part by calculating critical areas. The results of the logic diagnosis may comprise ranking information of the suspects in each of the diagnosis reports.

In another aspect, there are one or more non-transitory computer-readable media storing computer-executable instructions for causing one or more processors to perform the above method.

In still another aspect, there is a system, comprising: one or more processors, the one or more processors programmed to perform the above method.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed techniques. Thus, for example, those skilled in the art will recognize that the disclose techniques may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNIQUES

General Considerations

Various aspects of the disclosed technology relate to cell-aware yield analysis. In the following description, numerous details are set forth for the purpose of explanation. However, one of ordinary skill in the art will realize that the disclosed technology may be practiced without the use of these specific details. In other instances, well-known features have not been described in details to avoid obscuring the disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

The detailed description of a method or a device sometimes uses terms like "perform" and "determine" to describe the disclosed method or the device function/structure. Such terms are high-level descriptions. The actual operations or functions/structures that correspond to these terms will vary depending on the particular implementation and are readily discernible by one of ordinary skill in the art.

Additionally, as used herein, the term "design" is intended to encompass data describing an entire integrated circuit device. This term also is intended to encompass a smaller group of data describing one or more components of an entire device such as a portion of an integrated circuit device nevertheless.

Illustrative Operating Environment

Figure 1:
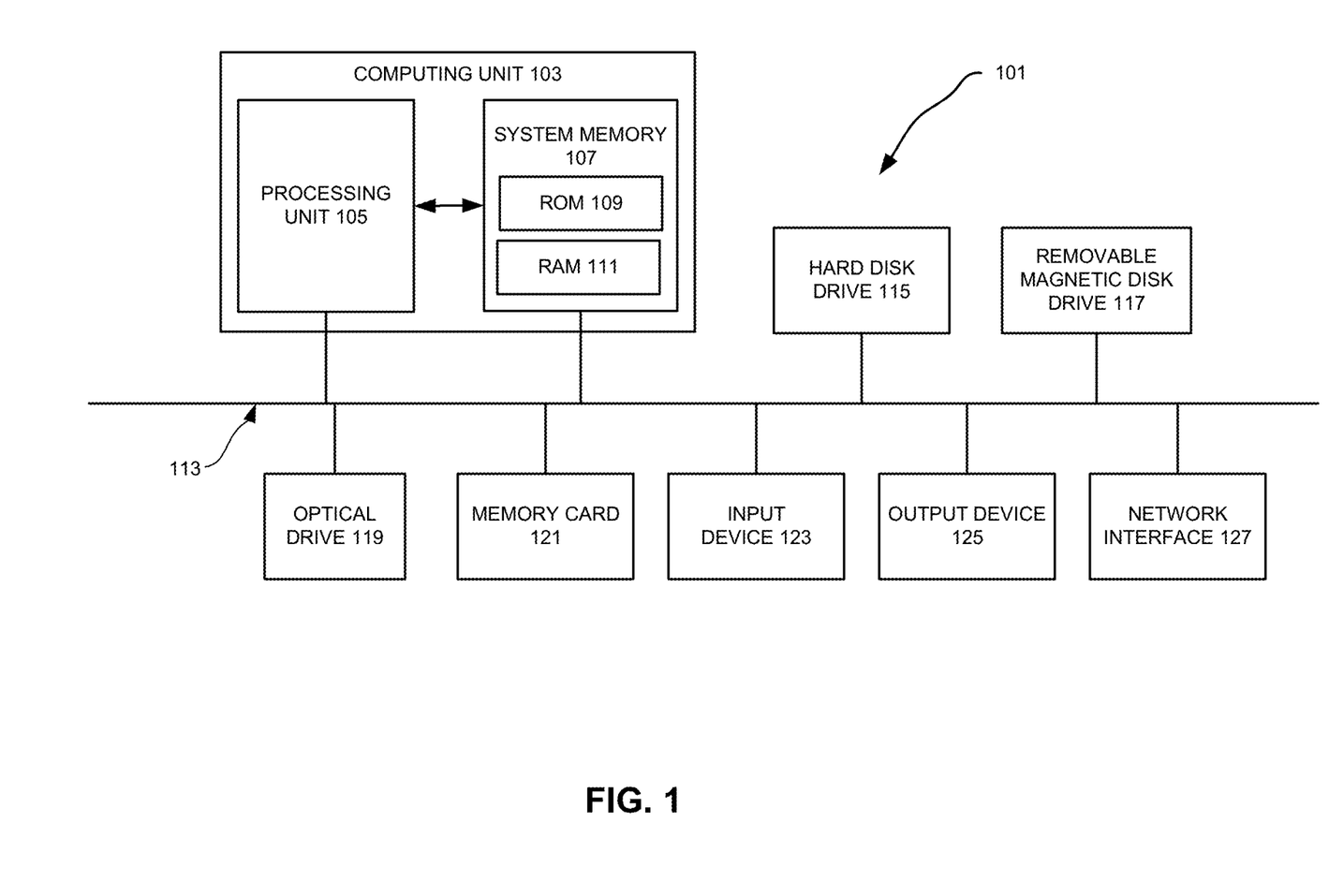
FIG. 1 illustrates a programmable computer system with which various embodiments of the disclosed technology may be employed.

Various examples of the disclosed technology may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but it will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it is not intended to be limiting. Various embodiments of the disclosed technology may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the disclosed technology may be implemented using a multi-processor computer, a plurality of single and/or multiprocessor computers arranged into a network, or some combination of both.

Design For Test, Test Pattern Generation, Testing And Diagnosis

The reduction in feature size increases the probability that a manufacture defect in the integrated circuit will result in a faulty chip. A very small defect can result in a faulty transistor or interconnecting wire. Even a single faulty transistor or wire can cause the entire chip to function improperly. Manufacture defects are unavoidable nonetheless, no matter whether the manufacturing process is at the prototype stage or the high-volume manufacturing stage. It is thus necessary to test chips during the manufacturing process. Diagnosing faulty chips is also needed to ramp up and to maintain the manufacturing yield.

Testing typically includes applying a set of test stimuli (test patterns) to the circuit-under-test and then analyzing responses generated by the circuit-under-test. Functional testing attempts to validate that the circuit-under-test operates according to its functional specification while structural testing tries to ascertain that the circuit-under-test has been assembled correctly from some low-level building blocks as specified in a structural netlist and that these low-level building blocks and their wiring connections have been manufactured without defect. For structural testing, it is assumed that if functional verification has shown the correctness of the netlist and structural testing has confirmed the correct assembly of the structural circuit elements, then the circuit should function correctly. Structural testing has been widely adopted at least in part because it enables the test (test pattern) generation to focus on testing a limited number of relatively simple circuit elements rather than having to deal with an exponentially exploding multiplicity of functional states and state transitions.

To make it easier to develop and apply test patterns, certain testability features are added to circuit designs, which is referred to as design for test or design for testability (DFT). Scan testing is the most common DFT method. In a basic scan testing scheme, all or most of internal sequential state elements (latches, flip-flops, et al.) in a circuit design are made controllable and observable via a serial interface. These functional state elements are usually replaced with dual-purpose state elements called scan cells. Scan cells are connected together to form scan chains—serial shift registers for shifting in test patterns and shifting out test responses. A scan cell can operate as originally intended for functional purposes (functional/mission mode) and as a unit in a scan chain for scan (scan mode). A widely used type of scan cell include an edge-triggered flip-flop with two-way multiplexer for the data input. The two-way multiplexer is typically controlled by a single control signal called scan enable, which selects the input signal for a scan cell from either a scan signal input port or a system signal input port. The scan signal input port is typically connected to an output of another scan cell while the system signal input port is connected to the functional logic. Scan cells can serve as both a control point and an observation point. Control points can be used to set certain logic values at some locations of the circuit-under-test, exciting (activating) a fault and propagating the incorrect value to an observation point. Scan testing allows the test equipment to access gates deeply embedded through the primary inputs/outputs and/or some physical test points and can remove the need for complicated state transition sequences when trying to control or observe what is happening at some internal circuit element.

Test patterns for scan testing are typically generated through an automatic test pattern generation (ATPG) process. ATPG usually focuses on a set of faults derived from a gate-level fault model. A defect is an error caused in a device during the manufacturing process. A fault model is a description of how a defect alters design behavior. In another word, a defect is a flaw or physical imperfection that may lead to a fault. For a given target fault, ATPG comprises two phases: fault activation and fault propagation. Fault activation establishes a signal value at the fault site opposite that produced by the fault. Fault propagation propagates the fault effect forward by sensitizing a path from a fault site to a scan cell or a primary output. A fault at a site is said to be detected by a test pattern if a test response value captured by a scan cell or a primary output is different than the expected value. The objective of ATPG is to find a test pattern that, when applied to the circuit, enables testers to distinguish between the correct circuit behavior and the faulty circuit behavior caused by one or more particular faults. Effectiveness of ATPG is measured by the fault coverage achieved for the fault model and the number of generated vectors (test pattern counts), which should be directly proportional to test application time. Here, the fault coverage is defined as a ratio of the number of detected faults vs. the total number of faults.

The most popular fault model used in practice is the single stuck-at fault model. In this model, one of the signal lines in a circuit is assumed to be stuck at a fixed logic value, regardless of what inputs are supplied to the circuit. The stuck-at fault model is a logical fault model because no delay information is associated with the fault definition. Delay faults cause errors in the functioning of a circuit based on its timing. They are caused by the finite rise and fall time periods of the signals in the gates, as well as, the propagation delay of interconnects between the gates. Transition faults are used for their simplicity in modeling spot defects that affect delays at inputs or outputs of gates. Under scan-based tests, the transition faults are associated with an extra delay that is large enough to cause the delay of any path through the fault site to exceed the clock period. Cell internal fault models can be derived using transistor-level circuit simulations (analog simulations). This approach can pinpoint the defect location within a cell for various cell internal defects.

During the circuit design and manufacturing process, a manufacturing test screens out chips (dies) containing defects. The test itself, however, does not identify the reason for the unacceptable low or fluctuating yield that may be observed. Physical failure analysis (PFA) can inspect the faulty chip to locate the defect location(s) and to discover the root cause. The process usually includes etching away certain layers and then imaging the silicon surface by scanning electronic microscopy or focused ion beam systems. This PFA process is laborious and time consuming. To facilitate the PFA process, diagnosis (also referred to as scan diagnosis) is often employed to narrow down possible locations of the defect(s) based on analyzing the fail log (fail file, failure file, or failure report). The fail log typically contains information about when (e.g., tester cycle), where (e.g., at what tester channel), and how (e.g., at what logic value) the test failed and which test patterns generate expected test responses. The layout information of the circuit design may also be employed to further reduce the number of defect suspects.

Diagnosis includes logic diagnosis (sometimes referred to as scan diagnosis or diagnosis) and chain diagnosis. Logic diagnosis may employ a fault dictionary or directly examine the syndrome (i.e., the effect) of the failing chip to determine likely defect locations (defect suspects). The latter approach may include structural pruning (backtracing), fault injection, and evaluation (fault simulation for both failing and passing test patterns). The quality of diagnosis can be measured by diagnostic resolution (the number of the real defects vs. the number of the defect suspects). Diagnostic resolution is linked not only to the algorithm used for diagnosis but also to the test patterns used for the manufacturing test (manufacturing test patterns). To enhance the diagnosis quality, a diagnostic test pattern generation process may be employed. This process generates test patterns that can refine the set of defect suspects.

All of the above mentioned processes, design insertion for testing, test pattern generation, and logic diagnosis, are normally performed by various electronic design automation tools such as those in the Tessent family of software tools available from Mentor Graphics Corporation, Wilsonville, Oreg.

Cell-Aware Diagnosis

A cell is a high-level representation of a component within a schematic diagram or physical layout of an electronic circuit. In designing application-specific integrated circuits (ASICs) with mostly digital-logic features, a standard cell library is usually used. The standard cell library comprises pre-defined digital building blocks—standard cells. A standard cell is a group of transistor and interconnecting structures that provides a boolean logic function (e.g., AND, OR, XOR, XNOR, inverters) or a storage function (flip-flop or latch). These standard cells have optimized layouts and are fully characterized for performance. They typically are of a fixed height, enabling them to be placed in rows and thus easing the process of automated digital layout. Standard cell libraries provide identical functional cells between process nodes or between different process technologies, making cell-based circuits more scalable and portable. In the present disclosure, a standard cell is referred to as a cell. A cell may also be a customized cell.

As discussed previously, in order to further resolve defects inside the cell boundary through scan diagnosis, the internal workings of the cell should be analyzed. There are many approaches. According to some embodiments of the disclosed technology, fault models for all possible inter-cell defects may be created for all cell types in a design. This can be achieved by starting with a cell physical layout and extracting a detailed parasitic SPICE (Simulation Program with Integrated Circuit Emphasis) analog simulation model from it. Also from the cell layout the likely locations of defects inside this cell may be extracted—Bridges where two nets come physically close to each other, Opens in various net segments and transistor defects modeled behaviorally as transistor stuck-ON and stuck-OFF. For each such defect, the SPICE model of the cell is altered to create a defective cell model. For example, the value of the resistor corresponding to an open in a section of a net in the SPICE model can be increased to be very large. Similarly for a bridge, a low resistance value can be inserted between the two involved nets. Finally, this defective cell model is exhaustively simulated using a SPICE analog simulator and the voltages at the cell outputs are interpreted to create a logical truth table model of the cell.

Figure 2:
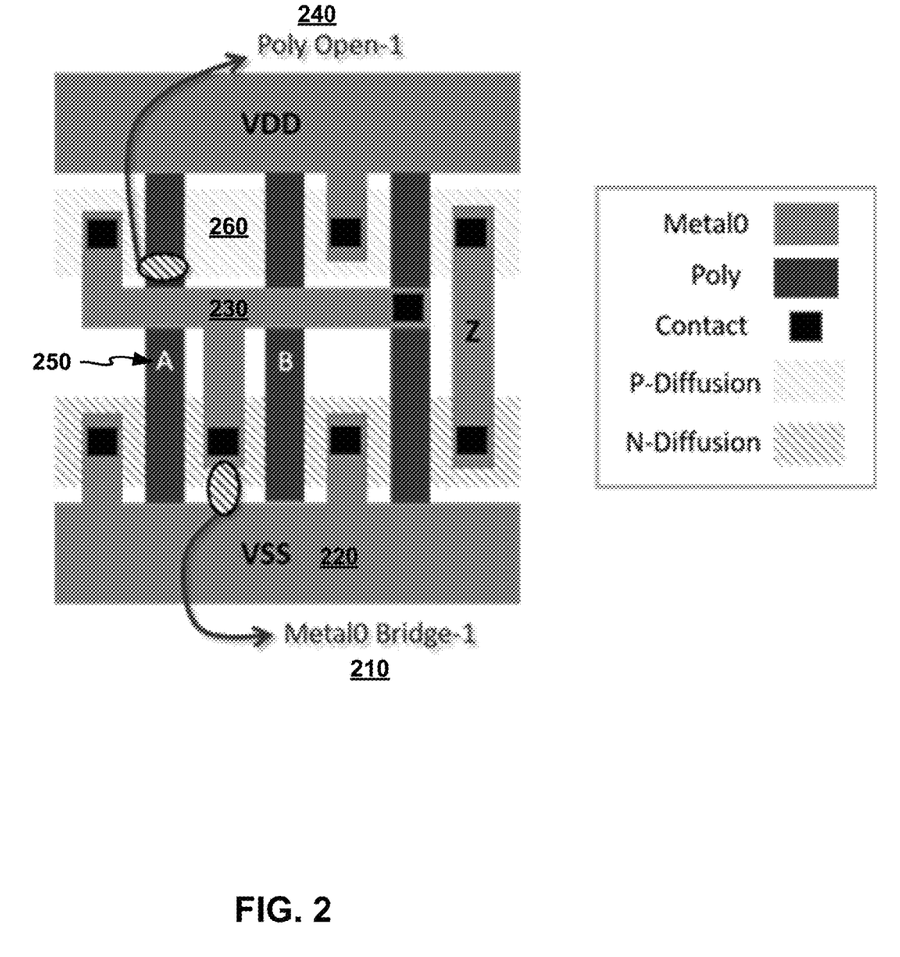
FIG. 2 illustrates an example of a layout for an OR logic gate.

FIG. 2 illustrates an example of a layout for an OR logic gate. This figure also shows two example defects, a metal0 short 210 between 'VSS' 220 and a net 230, and a poly open 240 between an input 250 and a gate 260 of a PMOS transistor. The defective cell model for the bridge defect is illustrated in the transistor level schematic in FIG. 3. The figure also shows how a truth table model for this defect can be constructed by analog simulating various input combinations. As an example when A(330)=0 and B(340)=0, a bridge 310 causes an output 320 to go from 0 to 1. All other input combinations cannot detect the bridge because at least one of the NMOS transistors will be ON, thus shorting the bridge 310. Thus, the defect model for Metal1) Bridge-1 210 will contain only one failing condition 'A B=00'. Similarly, logic models can be constructed for all other potential defects in the cell.

Figure 3:
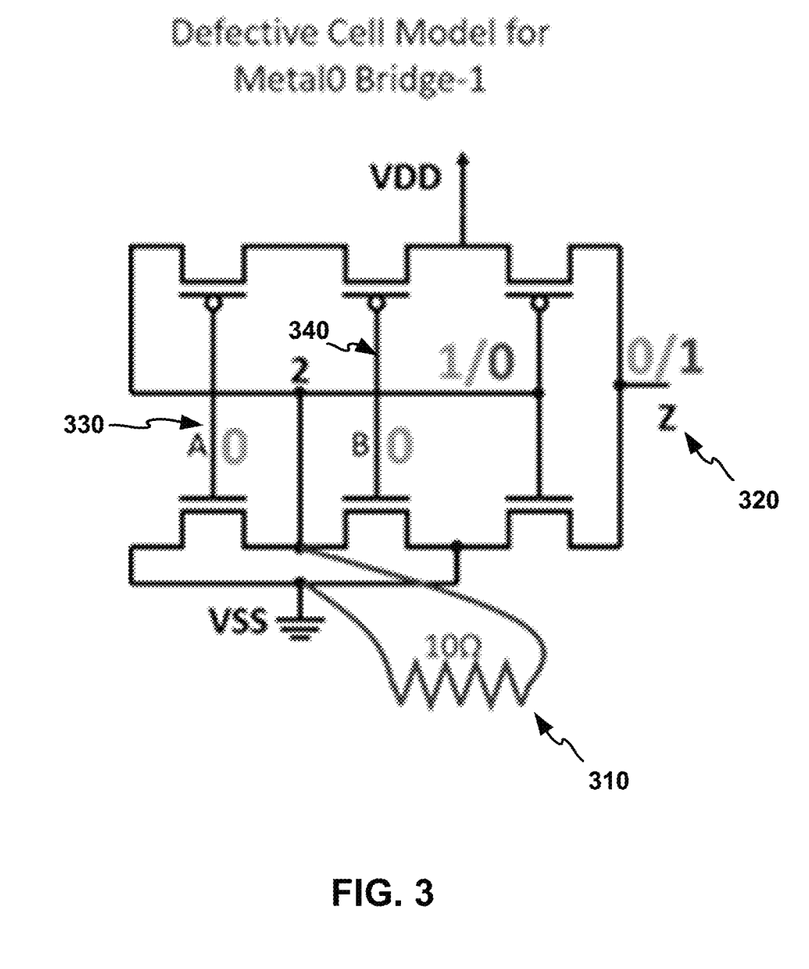
FIG. 3 illustrates an example of a defective cell model for a bridge defect using the transistor level schematic.
Figure 4:
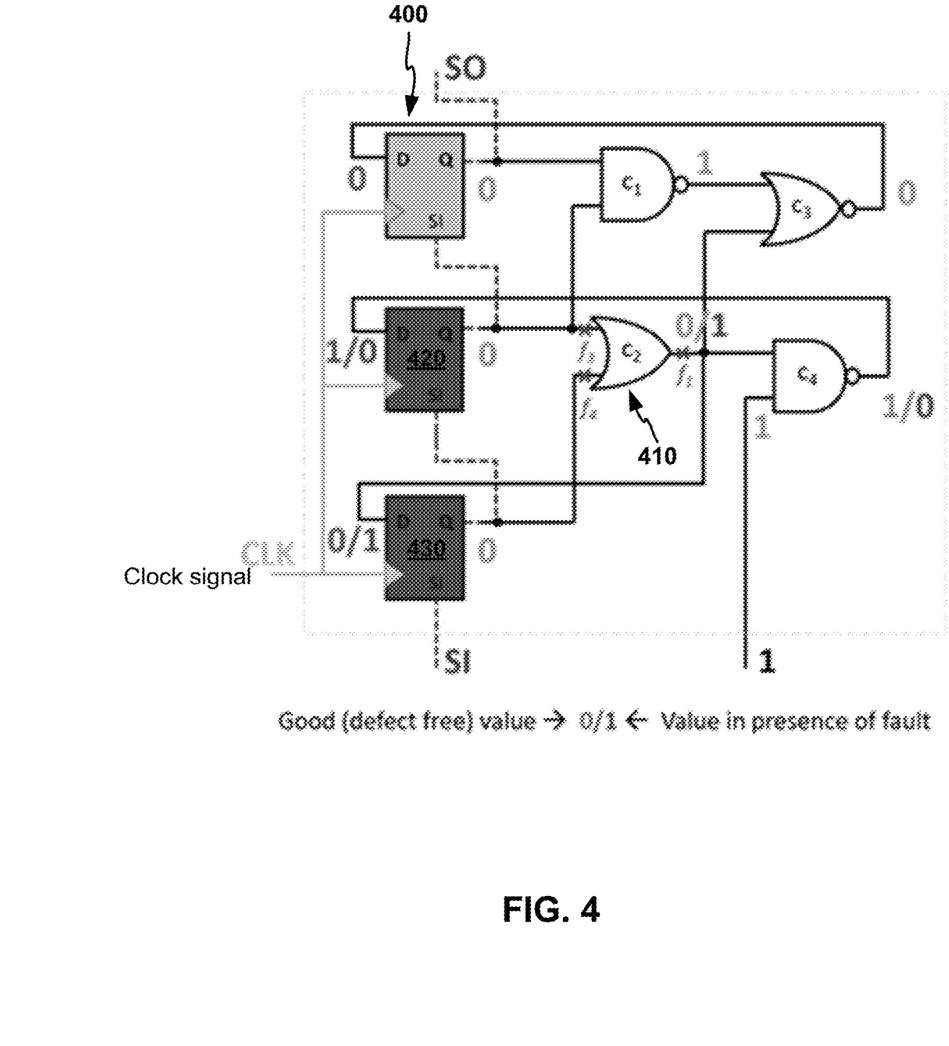
FIG. 4 illustrates an example of a simple circuit containing the OR gate illustrated in FIGS. 2 and 3.

FIG. 4 illustrates an example of a simple circuit containing the OR gate illustrated in FIGS. 2 and 3. The logic defect models constructed above can be used to simulate cell-internal defects and check whether the simulated failure response matches the good-machine test response. For example, simulating the Metal1) Bridge-1 210 in OR cell c2 (410), the inputs of c2 (410), set as '00', causes the output to change from 0 to 1. This change will get captured in the bottom two flops 420 and 430 in the scan chain 400. Here, the good machine test response values are 1 and 0 for the flops 420 and 430, comparing to 0 and 1 for the failure test response value. This is how the diagnosis can now report specific physical defect suspects inside the cell rather than just the whole cell itself and thus becomes cell-aware.

The diagnosis result for the example shown in FIG. 4 can comprise the several suspects such as M2, M3 and V2 opens on the net driven by OR cell c2, a M2 bridge between nets driven by c2 and c1 and a Metal1) bridge inside the OR cell c2. These suspects can be equally possible under the information available from a single failing test pattern. Multiple failing test patterns can help remove some suspects and even provide defect probability scores for the rest of the suspects. However, the problem of fake suspects cannot be solved due to diagnosis noises. More information can be extracted when a large number of failing dies are analyzed together.

Root Cause Deconvolution

Root cause deconvolution assumes the population of failing dies being analyzed has been created by a fixed defect mechanism, i.e., a fixed root cause distribution. A root cause can be any mechanism that leads to defects. A root cause is also referred to as a physical feature here. A generic root cause list typically includes opens and shorts on all physical layers in the design. For advanced nodes, interlayer bridges e.g. Via0 to Metal1) shorts are often considered as well. Let the root cause list be donated by:

$$rc_i 1 \leq i \leq N \text{ where } N = \text{number of root causes} \quad (1)$$

Due to the assumption, the probability of a failing die containing a defect from a root cause is the same for all dies in the population. Let this probability distribution be donated by:

$$\text{Prob}(rc_i) 1 \leq i \leq N \quad (2)$$

The goal of root cause deconvolution is to estimate the distribution from the diagnosis reports. To achieve it, a statistical model is built for determining the probability of seeing the given set of diagnosis reports (corresponding to the failing die in the population) as a function of the Prob($rc_i$). Let the set of diagnosis reports be denoted by:

$$D = \{\text{Diag}_j | 1 \leq j \leq F\} \quad (3)$$

where
F=number of failing die in the population
Assume that the diagnosis reports are independent:

$$\text{Prob}(\mathcal{D}) = \prod_{j=1}^{F} \text{Prob}(\text{Diag}_j) \quad (4)$$

The probability of seeing a diagnosis report Prob($\text{Diag}_j$) can be calculated by marginalizing over all the suspects in the report:

$$Prob(Diag_j) = \sum_{k=1}^{S_j} Prob(Diag_j/Susp_k)Prob(Susp_k) \quad (5)$$

where $Susp_k$ denotes the $k^{th}$ suspect in the report, $S_j$ is the total number of suspects in the report, and, $Prob(Susp_k)$ is the probability that $Susp_k$ is the real defect in the die. The other probability in the above equation, $Prob(Diag_j/Susp_k)$, is the probability of the particular diagnosis report if $Susp_k$ is the real suspect. In a perfect scenario, this probability will be 1, because whenever the same defect occurs in a die, the same diagnosis report is obtained. In another word, one defect should cause one failure file such that it should have one specific diagnosis report. However, due to the complexity of design and tests used, it is possible that some failure files do not match any suspect. As such, this probability may be less than 1 for suspects included in the diagnosis report to indicate they are close but not exact.

Coming back to $Prob(Susp_k)$, this can be expressed as by marginalizing over $Prob(rc_i)$:

$$Prob(Susp_k) = \sum_{i=1}^{N} Prob(Susp_k/rc_i)Prob(rc_i) \quad (6)$$

Here, $Prob(Susp_k/rc_i)$ is the probability that $Susp_k$ is the real defect if the root cause is $rc_i$. This probability is a function of relative likelihood of different defects from $rc_i$ being picked. This is calculated based on critical area of the open or bridge defect.

Combining Eqs. (4), (5) and (6), the likelihood of seeing the given set of diagnosis reports, Prob(D):

$$\prod_{j=1}^{F}\left\{\sum_{k=1}^{S_j} Prob(Diag_j/Susp_k)\left[\sum_{i=1}^{N} Prob(Susp_k/rc_i)Prob(rc_i)\right]\right\} \quad (7)$$

Here, $Prob(rc_i)$ is the unknown quantity and other probabilities can be calculated from diagnosis reports taking design characteristics (critical areas) into account. Having created the above probabilistic model, root cause deconvolution can estimate the unknown root cause distribution using the well-known Maximum Likelihood Estimation (MLE) learning technique. That is, the root cause distribution that maximizes the likelihood of seeing the given set of diagnosis reports should be the correct one. Root cause deconvolution is cognizant of the diagnosis ambiguity in its probabilistic modeling itself, so this ambiguity gets inherently handled. However, in a practical situation with a limited sample size (i.e. number of given diagnosis reports) and correlation among different root causes can cause some inaccuracies in the root cause deconvolution results.

Once the root cause distribution has been calculated, the probability that $Susp_k$ is the real defect in failing die j, given its diagnosis report Diagi can be calculated using Baye's theorem:

$$Prob(Susp_k/Diag_j) = \frac{Prob(Diag_j/Susp_k)Prob(Susp_k)}{Prob(Diag_j)} \quad (8)$$

The derived probability of a suspect being real can be used to guide PFA.

Yield Analysis Tool

Figure 5:
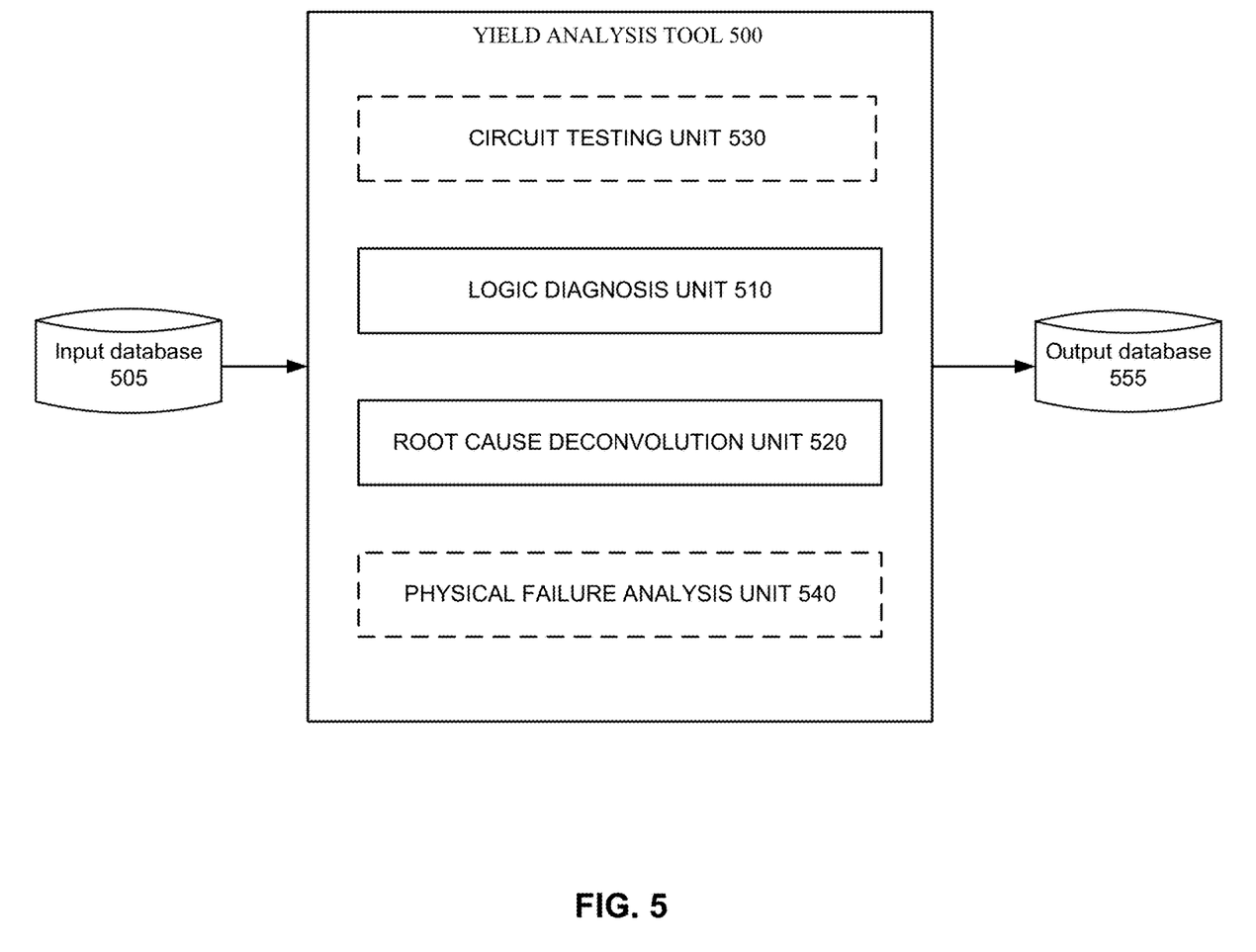
FIG. 5 illustrates a yield analysis tool according to various embodiments of the disclosed technology

FIG. 3 illustrates an example of a yield analysis tool 500 that may be implemented according to various embodiments of the disclosed technology. As seen in this figure, the yield analysis tool 500 includes a logic diagnosis unit 510 and a root cause deconvolution unit 520. Some implementations of the yield analysis tool 500 may cooperate with (or incorporate) one or more of a circuit testing unit 530, a physical failure analysis unit 540, an input database 505, and an output database 555.

As will be discussed in more detail below, the yield analysis tool 500 receives failure reports for a plurality of integrated circuits from the database 505. The plurality of integrated circuits were fabricated according to a circuit design. The circuit testing unit 530 may be employed to test fabricated integrated circuits and generate the failure reports for those failing the test. The logic diagnosis unit 510 performs logic diagnosis on the failing reports to derive a diagnosis report for each of the failing reports. Here, the diagnosis report comprises information of suspects for the integrated circuit associated with the each of the failing reports. The suspects comprise cell internal suspects and interconnect suspects. The root cause deconvolution unit 520 determines a probability distribution of root causes which maximizes a likelihood of observing the diagnosis reports based on a probability for each of the suspects given each of the root causes and a probability for each of the diagnosis reports given each of the suspects. Each of the root causes is a physical layout feature that can cause defects. The probability for each of the suspects given each of the root causes can be determined based on layout information of the circuit design. The probability for each of the diagnosis reports given each of the suspects can be determined based on results of the logic diagnosis. The probability for each of the diagnosis reports given each of the cell internal suspects is weighted higher than the probability for each of the diagnosis reports given each of the interconnect suspects. The yield analysis tool 500 stores information of the probability distribution of the root causes in the output database 555. The physical failure analysis unit 540 can perform physical failure analysis on some of the integrated circuits to confirm existence of one or more of the root causes having the highest probabilities. The manufacturing process may be adjusted based on the confirmed root causes to improve or maintain the yield. Alternatively or additionally, the circuit design may be modified to improve the yield.

As previously noted, various examples of the disclosed technology may be implemented by one or more computing systems, such as the computing system illustrated in FIG. 1. Accordingly, one or both of the logic diagnosis unit 510 and the root cause deconvolution unit 520 may be implemented by executing programming instructions on one or more processors in one or more computing systems, such as the computing system illustrated in FIG. 1. Correspondingly, some other embodiments of the disclosed technology may be implemented by software instructions, stored on a non-transitory computer-readable medium, for instructing one or more programmable computers/computer systems to perform the functions of one or both of the logic diagnosis unit 510 and the root cause deconvolution unit 520. As used herein, the term "non-transitory computer-readable medium" refers to computer-readable medium that are capable of storing data for future retrieval and not propagating electro-magnetic waves. The non-transitory computer-readable medium may be, for example, a magnetic storage device, an optical storage device, or a solid state storage device.

It also should be appreciated that, while the logic diagnosis unit 510 and the root cause deconvolution unit 520 are shown as separate units in FIG. 5, a single computer (or a single processor within a master computer) or a single computer system may be used to implement all of these units at different times, or components of these units at different times.

With various examples of the disclosed technology, the input database 505 and the output database 555 may be implemented using any suitable computer readable storage device. That is, either of the input database 505 and the output database 555 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, holographic storage devices, or any other non-transitory storage medium that can be used to store desired information. While the input database 505 and the output database 555 are shown as separate units in FIG. 5, a single data storage medium may be used to implement some or all of these databases.

Cell-Aware Yield Analysis Process

Figure 6:
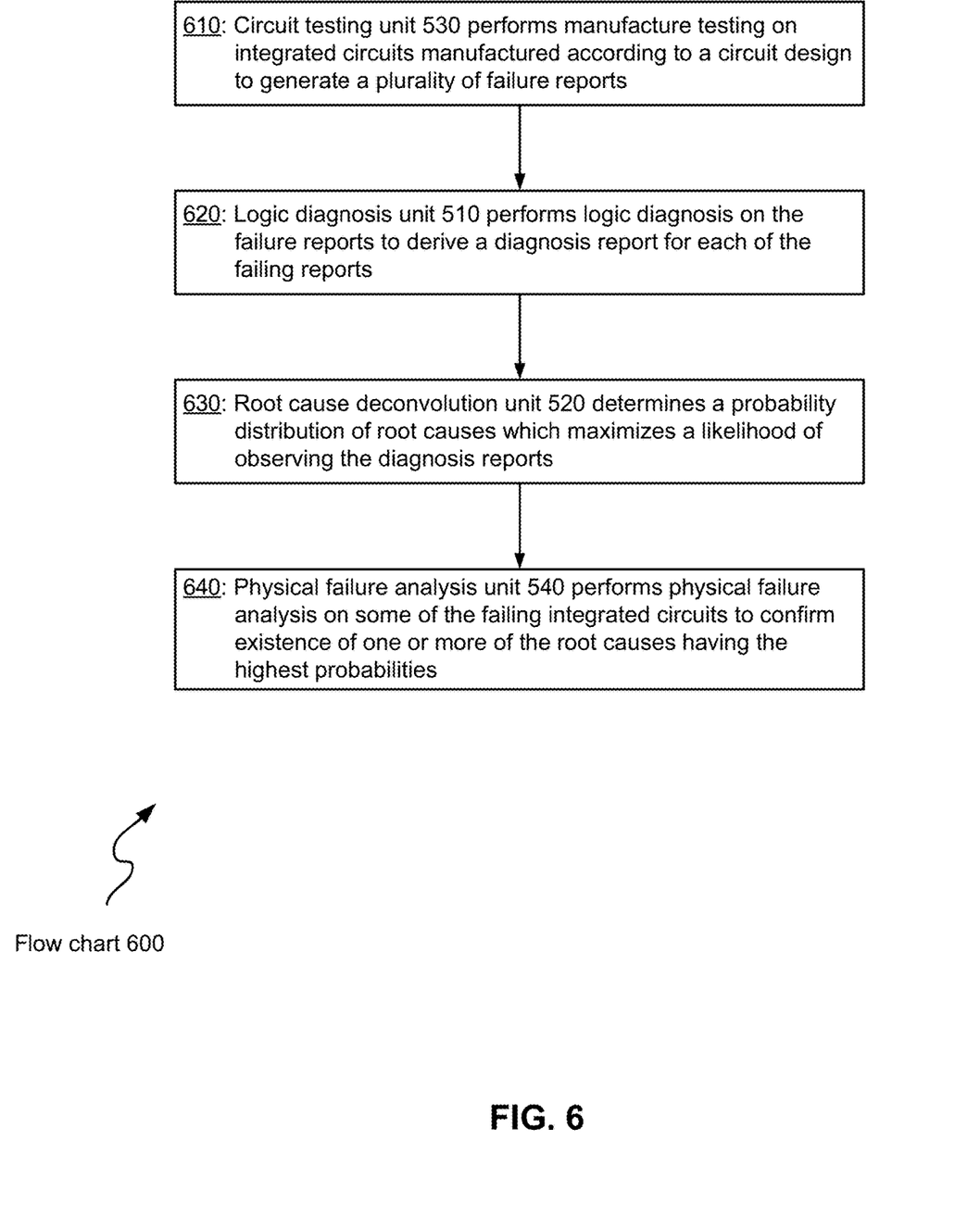
FIG. 6 illustrates a flowchart showing a process of cell-aware yield analysis that may be implemented according to various examples of the disclosed technology.

FIG. 6 illustrates a flowchart 600 showing a process of cell-aware yield analysis that may be implemented according to various examples of the disclosed technology. For ease of understanding, methods of cell-aware yield analysis that may be employed according to various embodiments of the disclosed technology will be described with reference to the yield analysis tool 500 illustrated in FIG. 5 and the flow chart 600 in FIG. 6. It should be appreciated, however, that alternate implementations of a yield analysis tool may be used to perform the method of cell-aware yield analysis in the flow chart 600 according to various embodiments of the disclosed technology. In addition, it should be appreciated that implementations of the yield analysis tool 500 may be employed to implement methods of cell-aware yield analysis according to different embodiments of the disclosed technology other than the one illustrated by the flow chart 600 in FIG. 6.

In operation 610, the circuit testing unit 530 performs manufacture testing on integrated circuits manufactured according to a circuit design. The circuit testing unit 530 can be implemented with automatic test equipment (ATE). ATE can apply test patterns to integrated circuit and can collect the test responses. The test patterns can be generated for the circuit design by ATPG. The test patterns can be generated for testing conventional stuck-at faults and/or transition faults. The test patterns may further comprise test patterns targeting cell-internal defects. By analyzing the test responses, the circuit testing unit 530 generates failure reports for a plurality of integrated circuits that fail the testing. Each of the failure reports can include information about which test patterns passed (i.e, the test responses for these test patterns matching the good-machine test responses) and which test patterns failed (i.e, the test responses for these test patterns not matching the good-machine test responses) along with location information of the failing bits (i.e, bits of the test responses not matching those of the good-machine test responses). The failure reports may be stored in the input database 505.

In operation 620, the logic diagnosis unit 510 performs logic diagnosis on the failure reports to derive a diagnosis report for each of the failing reports. The logic diagnosis unit 510 can perform logic diagnosis using various approaches. For example, fault simulations can be performed to determine the possible responses to a given test pattern in the presence of faults. A fault table or a fault dictionary is then constructed based on the simulation results. The defect candidate determination unit 340 can try to match the actual result of applying the test patterns to the circuit with one of the pre-computed expected results stored in the fault table (dictionary). The result of applying the test patterns to the circuit represents a combination of effects of the fault to each test pattern. The look-up results show the defect candidate sites.

Figure 7:
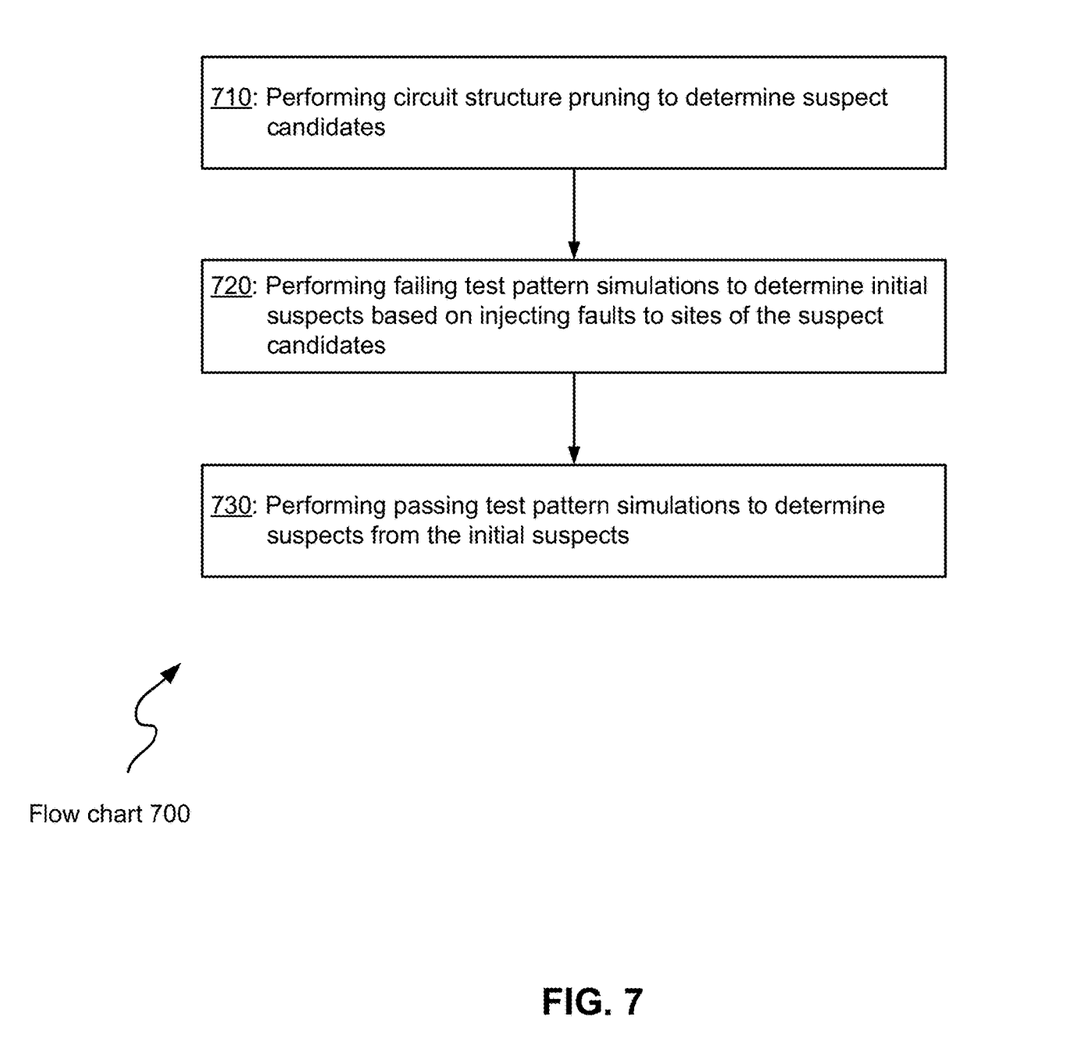
FIG. 7 illustrates a flowchart showing a different process of logic diagnosis that may be implemented according to various examples of the disclosed technology.

FIG. 7 illustrates a flowchart 700 showing a different process of logic diagnosis that may be implemented according to various examples of the disclosed technology. In operation 710, the logic diagnosis unit 510 determines suspect candidate sites using a path-tracing approach. The path-tracing approach comprises probing from the scan cells/primary outputs that capture the failing bits into the circuit design. This backward path tracing traces along the sensitized paths obtained based on the good-circuit simulation results of the test patterns. The sensitized paths originated from a failing bit form a "cone". Cones for the failing bits of one test pattern may be processed through operations such as intersection and union to identify the defect candidate sites.

In operation 720 of the flowchart 700, the logic diagnosis unit 510 can inject a fault at each of the suspect candidate sites and simulate the failing test patterns included in the test patterns to derive simulated test responses. The simulated test responses are compared with the observed test responses. When matched, the defect candidate site may be designated as one of the initial defect suspects. The injected fault may be a stuck-at fault or a fault for cell internal defect.

In operation 730 of the flowchart 700, the logic diagnosis unit 510 can perform passing test pattern simulations to determine the suspects from the initial suspects. For an initial suspect, the test patterns that generate no failing bit are simulated. If the simulation results do not match the observation, the initial suspect may be removed from being considered as a suspect. Based on the failing test pattern simulations and the passing test pattern simulations, the logic diagnosis unit 510 may rank all of the suspects based on the number of the failing test patterns of which the failing bits can be explained by a suspect. The larger number of the failing test patterns, the higher the rank of the suspect.

Figure 8:
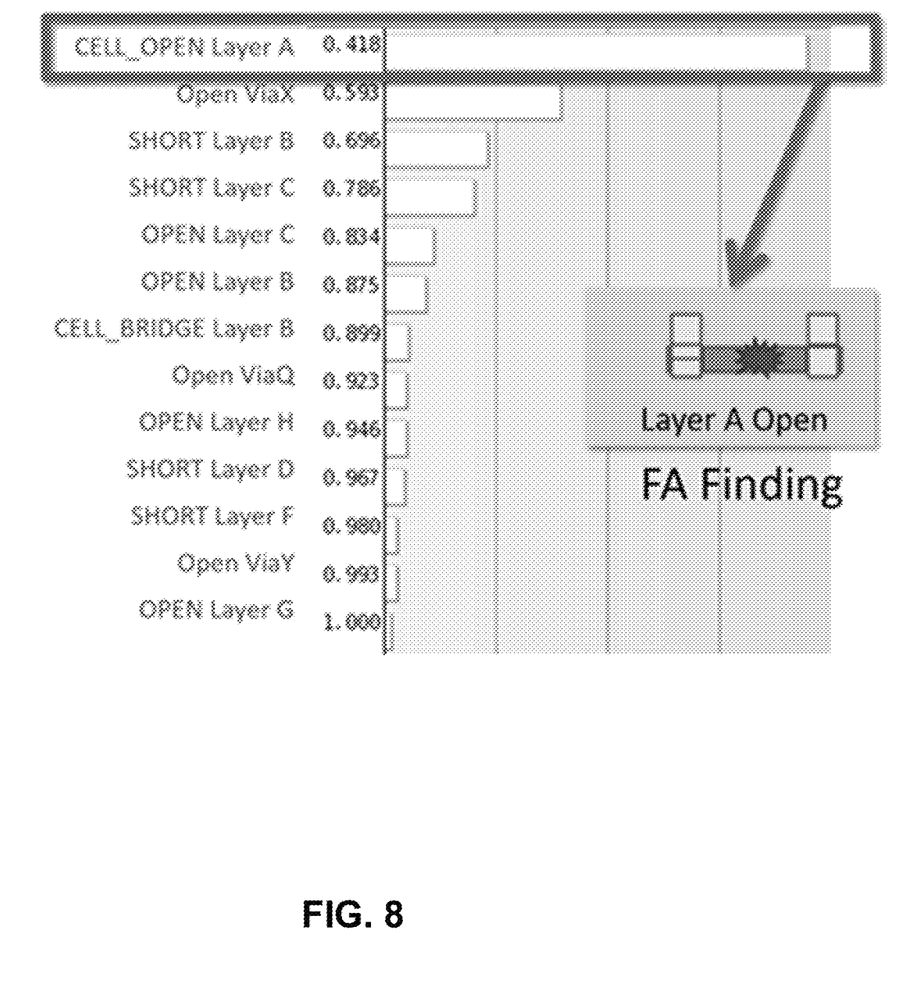
FIG. 8 illustrates an example of a probability distribution of root causes derived based on an embodiment of the disclosed technology.
Figure 9:
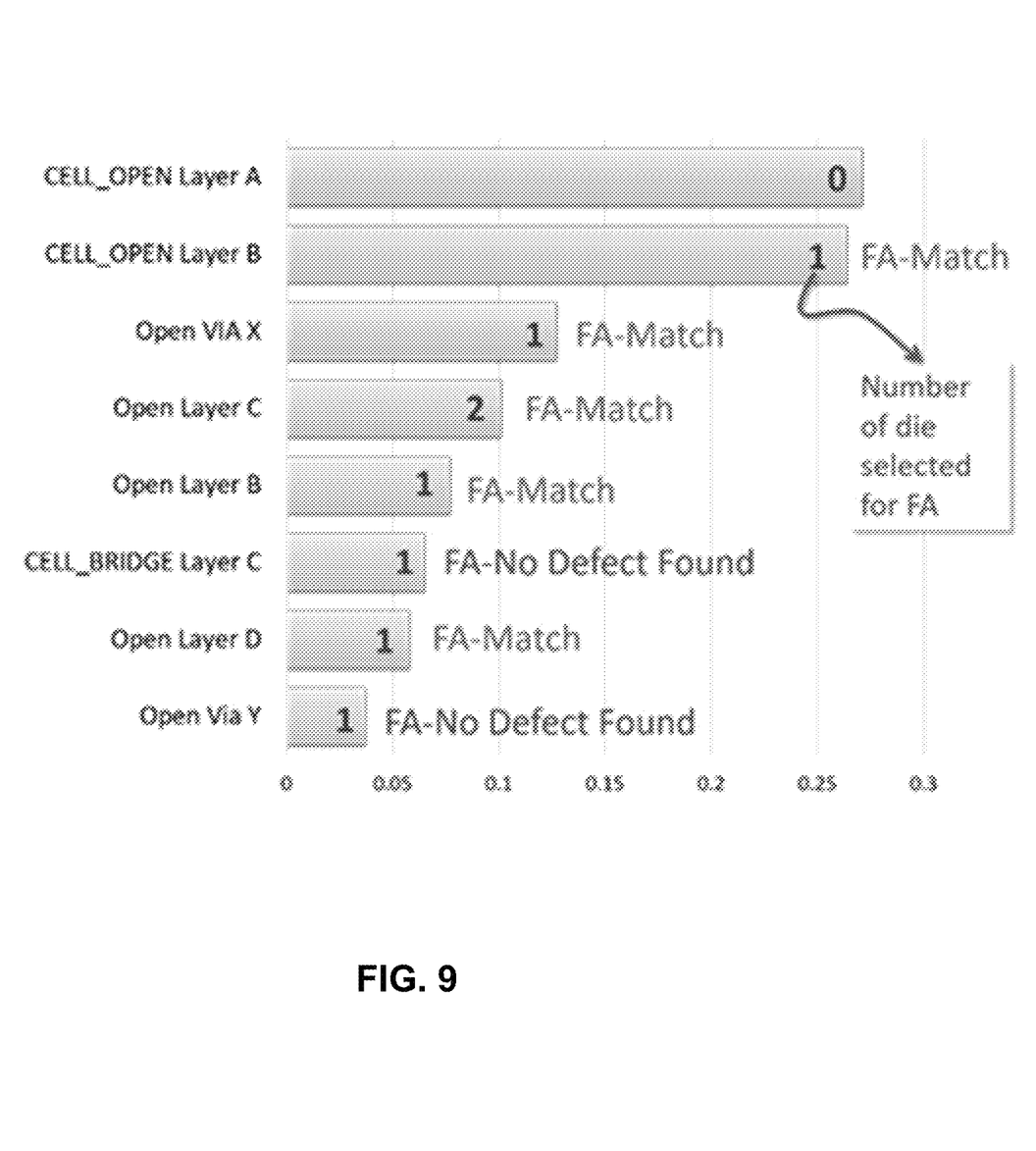
FIG. 9 illustrates another example of a probability distribution of root causes derived based on an embodiment of the disclosed technology.

Refer back to the flowchart 600. In operation 630, the root cause deconvolution unit 520 determines a probability distribution of root causes which maximizes a likelihood of observing the diagnosis reports based on a probability for each of the suspects given each of the root causes and a probability for each of the diagnosis reports given each of the suspects. A detailed description of root cause deconvolution is shown in the section of Root Cause Deconvolution. The probability for each of the suspects given each of the root causes can be determined based on layout information of the circuit design. For example, critical areas may be calculated for the interconnect bridge and open suspects and the cell internal bridge and open suspects. The number of vias may be counted some of the open suspects. The probability for each of the diagnosis reports given each of the suspects can be determined based on results of the logic diagnosis. For example, a diagnosis report may give each of the suspects a score based on the ranking. The score can be used as a basis for determining the probability for each of the diagnosis reports given each of the suspects. The root cause deconvolution unit 520 place a higher weight on the probability for each of the diagnosis reports given each of the cell internal suspects than on the probability for each of the diagnosis reports given each of the interconnect suspects. For example, the difference may be between a factor of 1.5 and a factor of 4. This can be rationalized based on the fact that the cell internal suspects are determined based on fault models created using simulations whereas the interconnect suspects are determined based mainly on heuristics. FIGS. 8 and 9 illustrates two examples of probability distributions of root causes. In both figures, the root causes are listed on the vertical axis.

In operation 640, the physical failure analysis unit 540 performs physical failure analysis on some of the integrated circuits to confirm existence of one or more of the root causes having the highest probabilities. As noted previously, the operation usually includes etching away certain layers and then imaging the silicon surface by scanning electronic microscopy or focused ion beam systems. In FIG. 8, the layer A cell-open suspect has the largest probability and is confirmed by the physical failure analysis. In FIG. 9, one die for six of the suspects and two dies for the Open Layer C suspect are picked for the physical failure analysis. The suspects of Cell_Open Layer B, Open VIA X, Open Layer C, Open Layer B, and Open Layer D are confirmed to be real root causes whereas Cell_Bridge Layer C and Open Via Y turn out to be fake root causes.

The confirmed root causes can be used for adjusting the manufacturing process and/or manufacturing equipment to improve/maintain the yield. Alternatively or additionally, the circuit design may be modified based on the confirmed root causes to improve the yield.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. A method, executed by at least one processor of a computer, comprising:
   receiving failure reports for a plurality of integrated circuits fabricated according to a circuit design, each of the failure reports comprising test results obtained using test patterns to test one of the integrated circuits, each of the integrated circuits generating test responses different from good-machine test responses for at least one of the test patterns;
   performing logic diagnosis on the failing reports to derive a diagnosis report for each of the failing reports, the diagnosis report comprising information of suspects, the suspects comprising cell internal suspects and interconnect suspects;
   determining a probability distribution of root causes which maximizes a likelihood of observing the diagnosis reports based on a probability for each of the suspects given each of the root causes and a probability for each of the diagnosis reports given each of the suspects, each of the root causes being a physical layout feature that can cause defects, the probability for each of the suspects given each of the root causes being determined based on layout information of the circuit design, the probability for each of the diagnosis reports given each of the suspects being determined based on results of the logic diagnosis, the probability for each of the diagnosis reports given each of the cell internal suspects being weighted higher than the probability for each of the diagnosis reports given each of the interconnect suspects; and
   storing information of the probability distribution of the root causes.

2. The method recited in claim 1, further comprising:
   performing physical failure analysis on some of the integrated circuits to confirm existence of one or more of the root causes having the highest probabilities.

3. The method recited in claim 2, further comprising:
   adjusting a manufacturing process based on the confirmed existence of one or more of the root causes.

4. The method recited in claim 1, wherein the probability for each of the diagnosis reports given each of the cell internal suspects is weighted higher than the probability for each of the diagnosis reports given each of the interconnect suspects by a factor of between 1.5 and 4.

5. The method recited in claim 1, wherein the probability for each of the suspects given each of the root causes is determined at least in part by calculating critical areas.

6. The method recited in claim 1, wherein the results of the logic diagnosis comprise ranking information of the suspects in each of the diagnosis reports.

7. One or more non-transitory computer-readable media storing computer-executable instructions for causing one or more processors to perform a method, the method comprising:
   receiving failure reports for a plurality of integrated circuits fabricated according to a circuit design, each of the failure reports comprising test results obtained using test patterns to test one of the integrated circuits, each of the integrated circuits generating test responses different from good-machine test responses for at least one of the test patterns;
   performing logic diagnosis on the failing reports to derive a diagnosis report for each of the failing reports, the diagnosis report comprising information of suspects, the suspects comprising cell internal suspects and interconnect suspects;
   determining a probability distribution of root causes which maximizes a likelihood of observing the diagnosis reports based on a probability for each of the suspects given each of the root causes and a probability for each of the diagnosis reports given each of the suspects, each of the root causes being a physical layout feature that can cause defects, the probability for each of the suspects given each of the root causes being determined based on layout information of the circuit design, the probability for each of the diagnosis reports given each of the suspects being determined based on results of the logic diagnosis, the probability for each of the diagnosis reports given each of the cell internal suspects being weighted higher than the probability for each of the diagnosis reports given each of the interconnect suspects; and storing information of the probability distribution of the root causes.

8. The one or more non-transitory computer-readable media recited in claim 7, wherein the method further comprises: performing physical failure analysis on some of the integrated circuits to confirm existence of one or more of the root causes having the highest probabilities.

9. The one or more non-transitory computer-readable media recited in claim 8, wherein the method further comprises: adjusting a manufacturing process based on the confirmed existence of one or more of the root causes.

10. The one or more non-transitory computer-readable media recited in claim 7, wherein the probability for each of the diagnosis reports given each of the cell internal suspects is weighted higher than the probability for each of the diagnosis reports given each of the interconnect suspects by a factor of between 1.5 and 4.

11. The one or more non-transitory computer-readable media recited in claim 7, wherein the probability for each of the suspects given each of the root causes is determined at least in part by calculating critical areas.

12. The one or more non-transitory computer-readable media recited in claim 7, wherein the results of the logic diagnosis comprise ranking information of the suspects in each of the diagnosis reports.

13. A system, comprising:
one or more processors, the one or more processors programmed to perform a method, the method comprising:
receiving failure reports for a plurality of integrated circuits fabricated according to a circuit design, each of the failure reports comprising test results obtained using test patterns to test one of the integrated circuits, each of the integrated circuits generating test responses different from good-machine test responses for at least one of the test patterns;
performing logic diagnosis on the failing reports to derive a diagnosis report for each of the failing reports, the diagnosis report comprising information of suspects, the suspects comprising cell internal suspects and interconnect suspects;
determining a probability distribution of root causes which maximizes a likelihood of observing the diagnosis reports based on a probability for each of the suspects given each of the root causes and a probability for each of the diagnosis reports given each of the suspects, each of the root causes being a physical layout feature that can cause defects, the probability for each of the suspects given each of the root causes being determined based on layout information of the circuit design, the probability for each of the diagnosis reports given each of the suspects being determined based on results of the logic diagnosis, the probability for each of the diagnosis reports given each of the cell internal suspects being weighted higher than the probability for each of the diagnosis reports given each of the interconnect suspects; and
storing information of the probability distribution of the root causes.

14. The system recited in claim 13, wherein the method further comprises: performing physical failure analysis on some of the integrated circuits to confirm existence of one or more of the root causes having the highest probabilities.

15. The system recited in claim 14, wherein the method further comprises: adjusting a manufacturing process based on the confirmed existence of one or more of the root causes.

16. The system recited in claim 13, wherein the probability for each of the diagnosis reports given each of the cell internal suspects is weighted higher than the probability for each of the diagnosis reports given each of the interconnect suspects by a factor of between 1.5 and 4.

17. The system recited in claim 13, wherein the probability for each of the suspects given each of the root causes is determined at least in part by calculating critical areas.

18. The system recited in claim 13, wherein the results of the logic diagnosis comprise ranking information of the suspects in each of the diagnosis reports.

\* \* \* \* \*